United States Patent [19]

Baliga et al.

[11] Patent Number: 4,567,641

[45] Date of Patent: Feb. 4, 1986

[54] METHOD OF FABRICATING SEMICONDUCTOR DEVICES HAVING A DIFFUSED REGION OF REDUCED LENGTH

[75] Inventors: Bantval J. Baliga, Clifton Park; Peter V. Gray, Scotia; Robert P. Love, Schenectady, all of N.Y.

[73] Assignee: General Electric Company, Schenectady, N.Y.

[21] Appl. No.: 650,314

[22] Filed: Sep. 12, 1984

Related U.S. Application Data

[62] Division of Ser. No. 367,316, Apr. 12, 1982, abandoned.

[51] Int. Cl.⁴ ................ H01L 21/441; H01L 21/465
[52] U.S. Cl. ........................................ 29/571; 29/578; 29/580; 357/22; 148/187
[58] Field of Search ................ 148/187; 29/571, 578, 29/580; 357/22 E

[56] References Cited

U.S. PATENT DOCUMENTS

| | | | |
|---|---|---|---|
| 4,272,302 | 6/1981 | Jhabvala | 148/187 X |
| 4,364,073 | 12/1982 | Becke et al. | 357/23 |
| 4,364,074 | 12/1982 | Garnache et al. | 357/23 |
| 4,374,455 | 2/1983 | Goodman | 148/187 X |
| 4,430,792 | 2/1984 | Temple | 148/187 X |
| 4,476,622 | 10/1984 | Cogan | 29/580 X |
| 4,497,109 | 2/1985 | Huber et al. | 148/1.5 X |
| 4,503,598 | 3/1985 | Vora et al. | 29/571 |

Primary Examiner—George T. Ozaki
Attorney, Agent, or Firm—John R. Rafter; James C. Davis, Jr.; Marvin Snyder

[57] ABSTRACT

An improved semiconductor device having a diffused region of reduced length and an improved method of fabricating such a semiconductor device are disclosed. The semiconductor device may be a MOSFET or an IGR, by way of example. In a form of the method of fabricating a MOSFET, an N+ SOURCE is diffused into a P BASE through a window of a diffusion mask. An anisotropic or directional etchant is applied to the N+ SOURCE through the same window. The etchant removes most of the N+ SOURCE, but allows shoulders thereof to remain intact. These shoulders, which form the completed N+ SOURCE regions, are of reduced length, greatly reducing the risk of turn-on of a parasitic bipolar transistor in the MOSFET. The risk of turn-on of a parasitic bipolar transistor in an IGR is similarly reduced, when the IGR is fabricated by the improved method.

10 Claims, 19 Drawing Figures

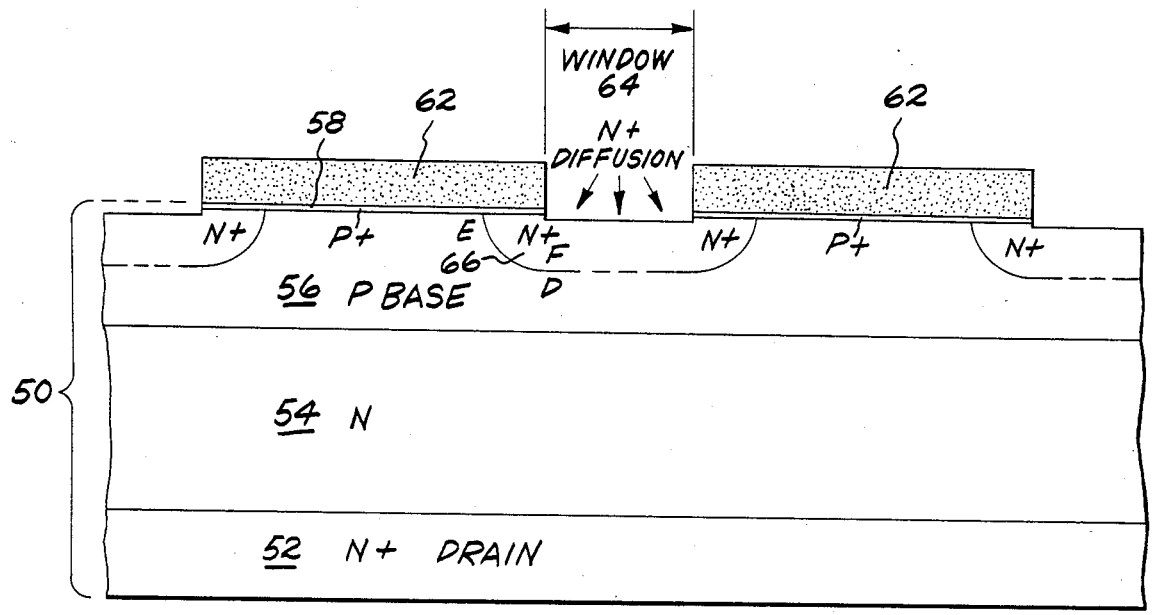
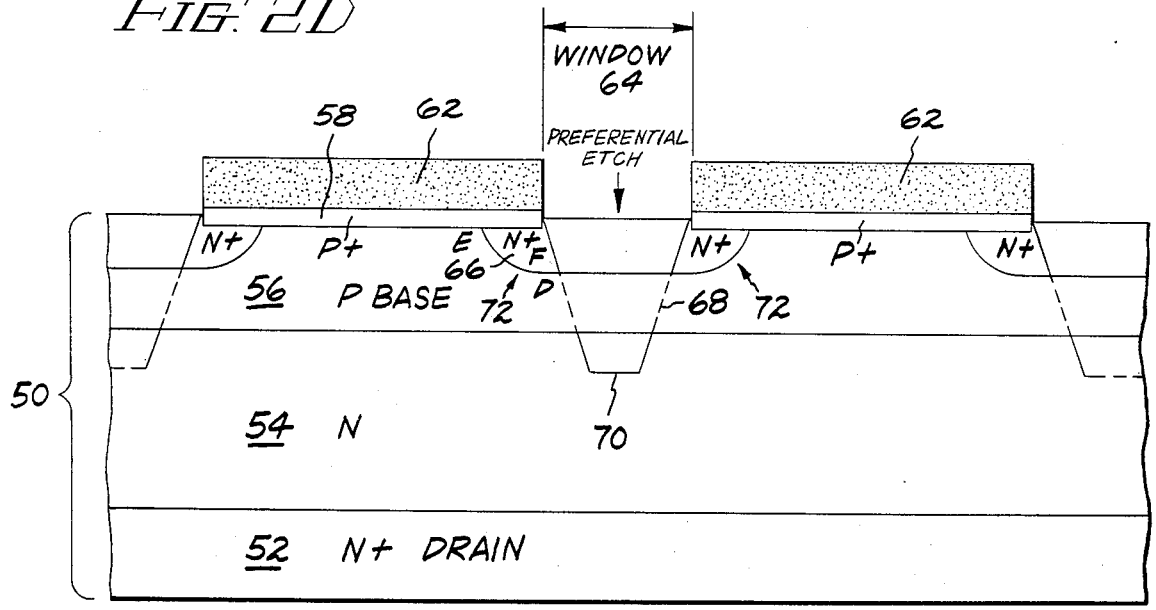

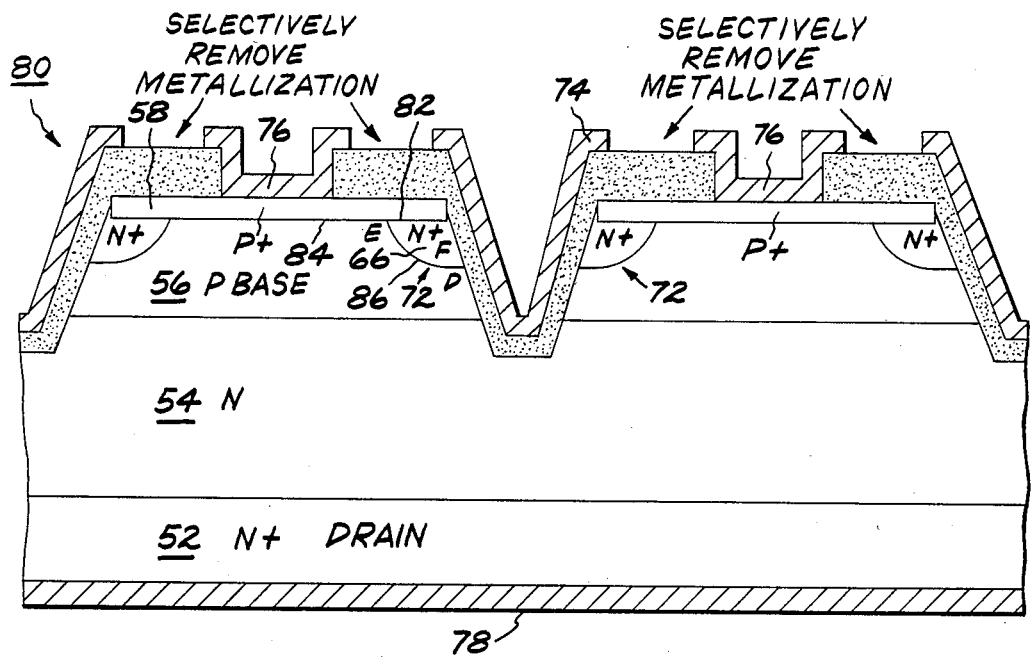
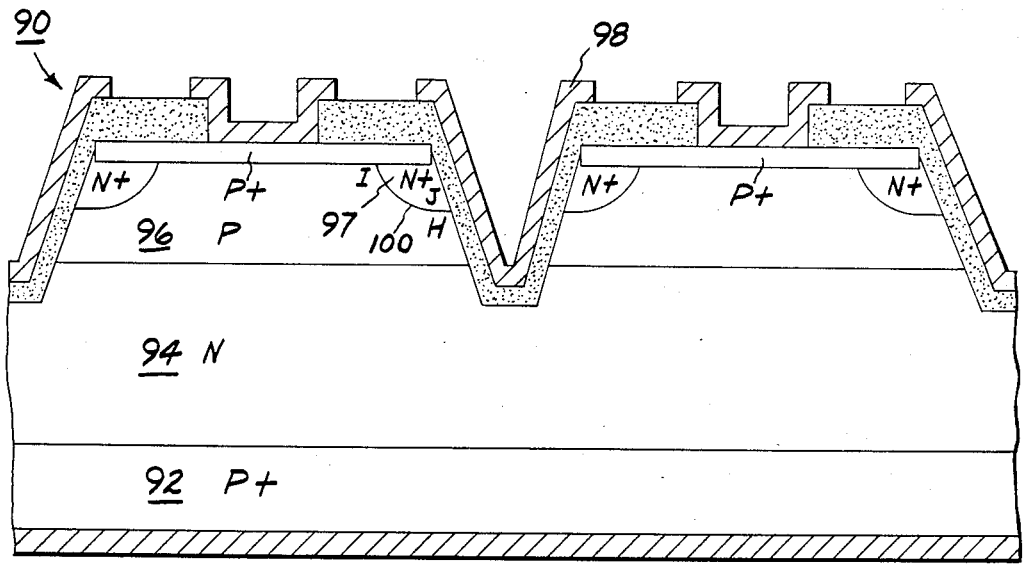

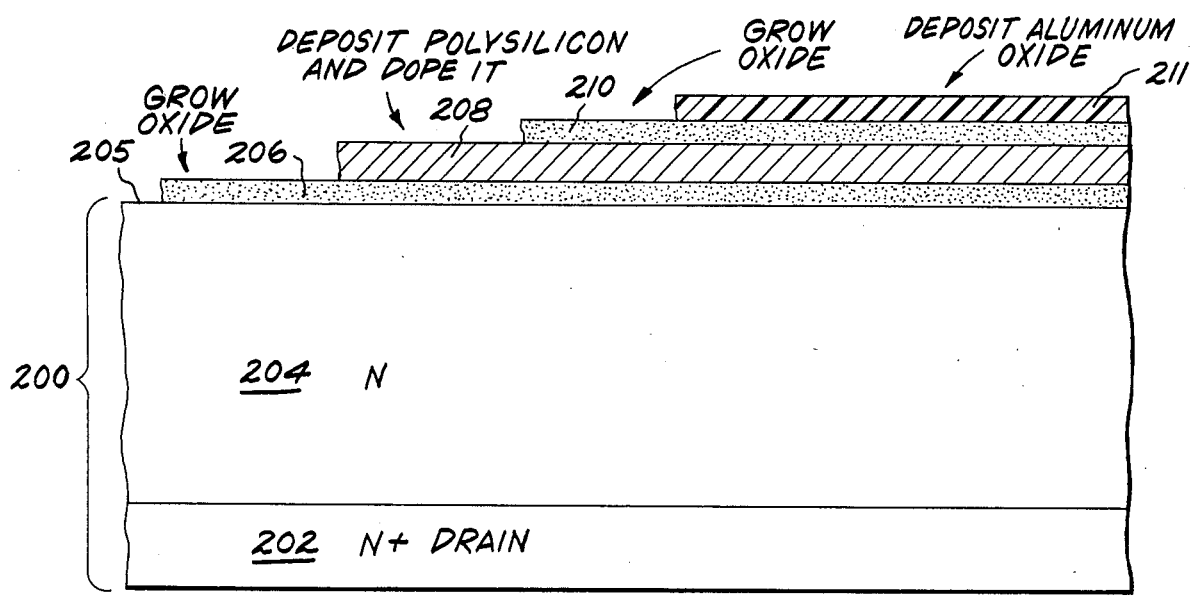
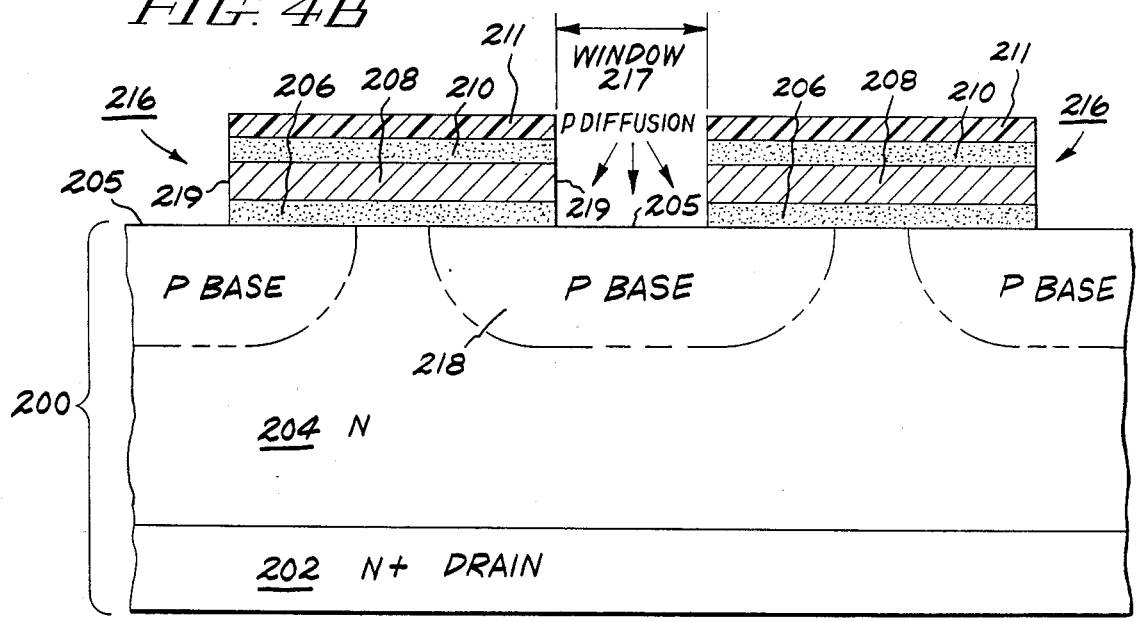

METHOD OF FABRICATING SEMICONDUCTOR DEVICES HAVING A DIFFUSED REGION OF REDUCED LENGTH

CROSS-REFERENCE TO RELATED APPLICATION

This application is a division of application Ser. No. 367,316, filed on Apr. 12, 1982, now abandoned.

The present application is related to commonly-owned U.S. Patent application Ser. No. 212,181, filed Dec. 2, 1980, by B. J. Baliga, entitled "Gate Enhanced Rectifier", abandoned in favor of continuation application Ser. No. 483,009, filed on Apr. 7, 1983. (A gate enhanced rectifier, or "GERECT", is referred to herein as an insulated gate rectifier, or "IGR").

SUMMARY OF THE INVENTION

Our invention relates to a semiconductor device having a diffused region of reduced length forming the SOURCE or corresponding region in a device other than a MOSFET, and to a method of fabricating the same.

Our invention is particularly useful in helping to prevent turn-on, or incipience of current conduction, in a parasitic bipolar transistor inherent in some types of semiconductor devices, such as MOSFETs or IGRs. Turn-on of such parasitic transistor is inevitably accompanied by a partial or total loss of control of current in the semiconductor device and may even result in complete destruction of the device.

To help prevent turn-on of an included parasitic bipolar transistor, a typical prior art device, for instance, a MOSFET, incorporates a "electrical short", or low resistance connection, between the adjoining SOURCE and BASE regions, which have a P-N junction between them. The purpose is to prevent such P-N junction from becoming forward biased above a threshold level that would induce turn-on of the parasitic transistor. To insure that no part of the P-N junction becomes excessively forward biased, the distance between the short and the furthest part of the P-N junction, which corresponds generally to the length of the SOURCE, should be minimized. The SOURCE, however has a minimum length typically in excess of about 10 micrometers, as a result of the prior art method of fabricating the MOSFET.

A prior art MOSFET is made by diffusing into its BASE a suitable type dopant, through a diffusion window, to form its source. Thereafter, an etchant is applied to the SOURCE through an etch window, to etch through an intermediate portion of the SOURCE. This requires aligning the etch window over the SOURCE, this alignment being a delicate procedure because the SOURCE is so small. Consequently, the SOURCE must be long enough to accommodate an alignment tolerance. It would thus be desirable to provide a semiconductor device having a diffused region (i.e., the SOURCE in a MOSFET) of reduced length.

Accordingly, it is an object of our invention to provide a semiconductor device having a diffused region of reduced length forming the SOURCE or corresponding region in a device other than a MOSFET and, in addition, a method of fabricating the same.

A further object of our invention is to provide a method of fabricating a semiconductor device not requiring a delicate alignment step for forming the SOURCE or corresponding region in a device other than a MOSFET.

Briefly stated, in carrying out one form of our invention as it applies to a MOSFET, we diffuse an N-type dopant into a P BASE, through a diffusion window, to form an N+ SOURCE. We then apply an anisotropic etchant, or etchant that etches only in a limited direction, to the N+ SOURCE through the same diffusion window. This etchant etches away most of the N+ SOURCE; however, the etchant allows shoulders of the SOURCE to remain intact each shoulder having a length approximately equal to its diffusion depth. These shoulders, which form the completed N+ SOURCE regions, are of dramatically reduced length; typically, they are each 1 micrometer long. No delicate alignment step to form the N+ SOURCE is required.

BRIEF DESCRIPTION OF THE DRAWINGS

While the specification concludes with claims particularly pointing out and distinctly claiming the subject matter which we regard as our invention, it is believed that the invention will be better understood from the following description, taken in connection with the drawings, in which:

FIGS. 2A-2G are schematic views in cross-section of selected steps of fabricating a MOSFET in accordance with our invention;

FIG. 3 is a view similar to FIG. 2G, illustrating an alternative semiconductor device in accordance with our invention;

FIGS. 4A-4G are views similar to FIGS. 2A-2G, illustrating a second embodiment of a method of fabricating a MOSFET in accordance with our invention.

DETAILED DESCRIPTION OF THE INVENTION

Figure 1A:
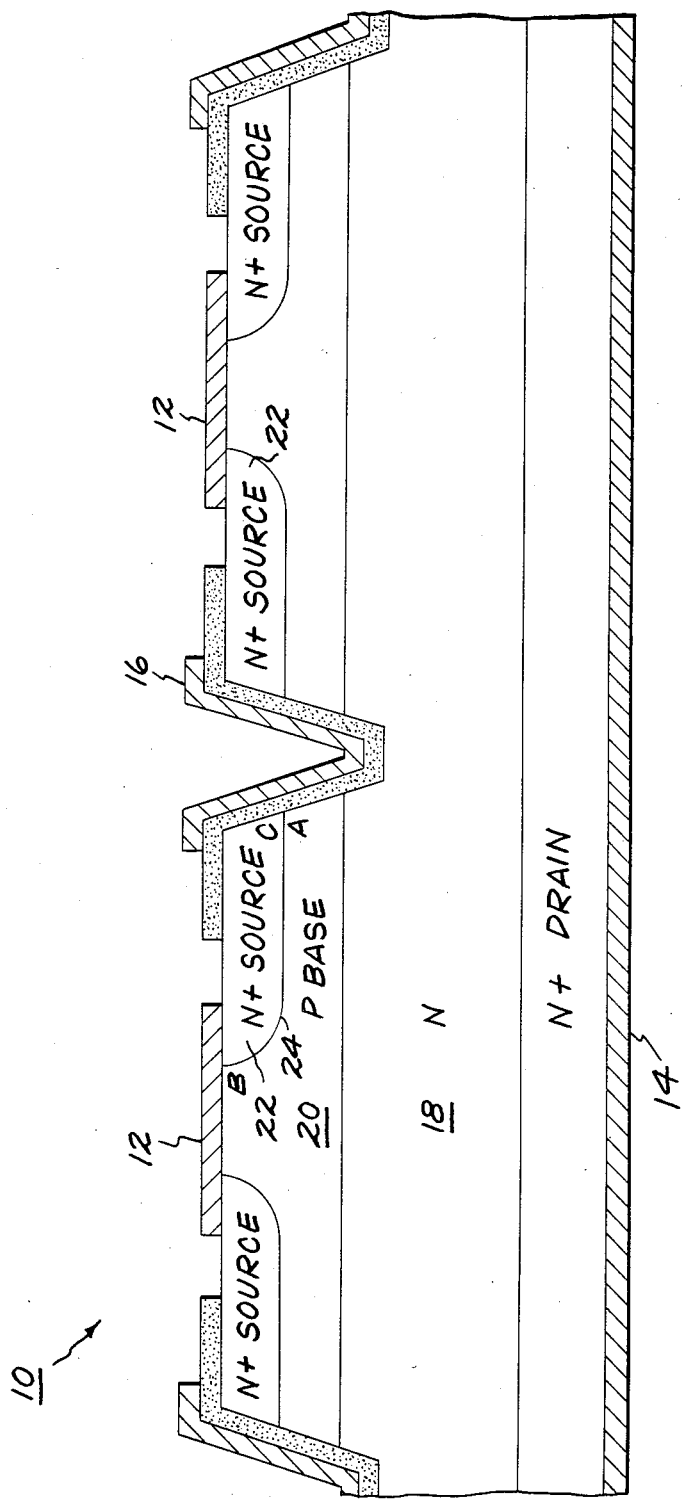
FIG. 1A is a schematic view in cross-section of a prior art MOSFET.
Figure 1B:
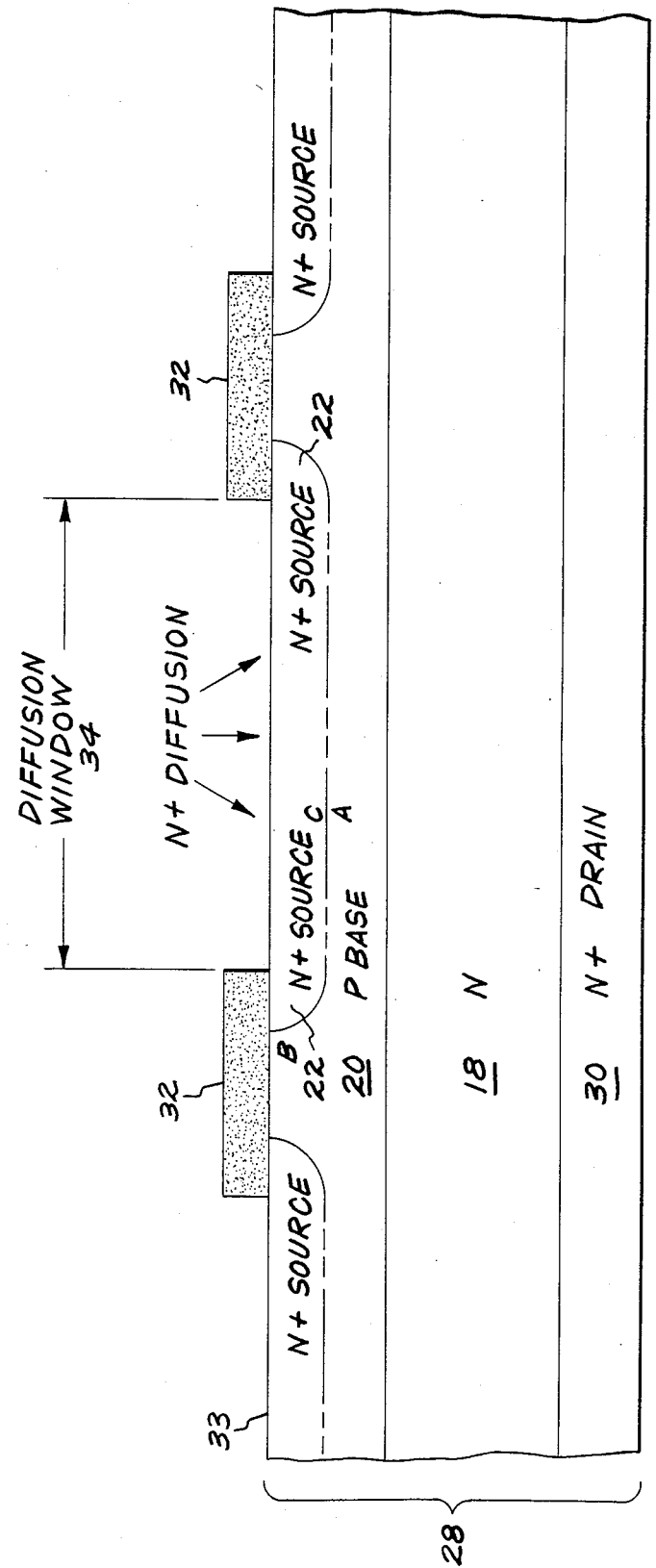
FIGS. 1B and 1C are views similar to FIG. 1A, illustrating selective prior art steps of fabricating the MOSFET of FIG. 1A.
Figure 1C:
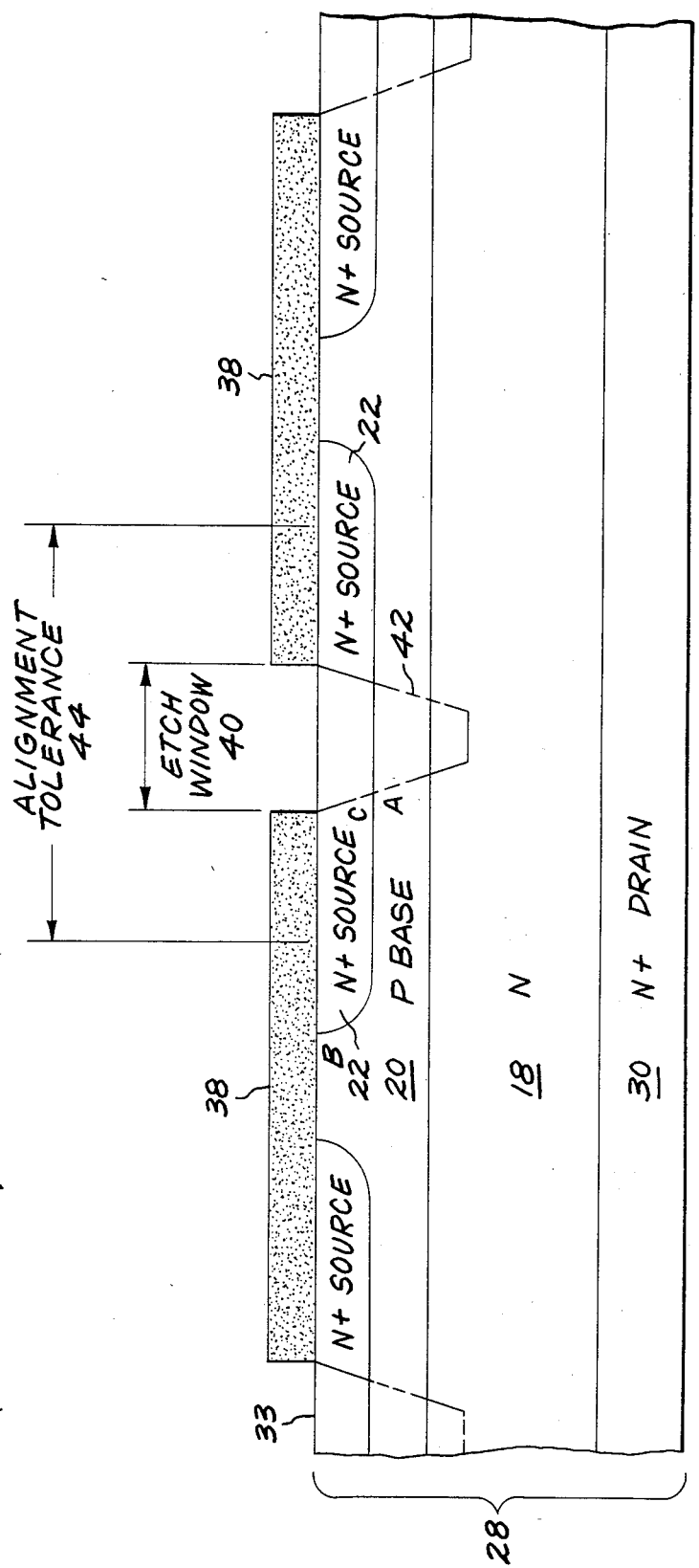

Our invention can be more fully understood by first considering the prior art in connection with FIGS. 1A-1C.

FIG. 1A illustrates a prior art MOSFET 10 having many identical "cells", or repeated units of structure. For simplicity, explicit reference is made only to the centrally depicted cell of the MOSFET 10.

The MOSFET 10 is typically used to control the current level in an external circuit (not shown), which is connected between its SOURCE and drain electrodes 12 and 14. In particular, the "gate" or control electrode 16 normally determines such current level, depending upon the amplitude of a control voltage impressed on it. Normal operation of the MOSFET 10 is subject, however, to the adverse effect of turn-on of its inherent parasitic N-P-N transistor, formed from N region 18, P BASE 20, and N+ SOURCE 22. If the parasitic transistor turns-on, the MOSFET 10 begins to lose control of the external circuit current level. The parasitic transistor can become so conductive that all control of the external circuit current level is lost, and the MOSFET 10 itself can be destroyed.

The parasitic transistor will turn-on if any portion of the P-N junction 24 between P BASE 20 and N+ SOURCE 22 (e.g., between locations A and C) becomes forward biased by more than about 0.7 volts (for a silicon device). To reduce this likelihood, an electrical short between P BASE 20 and N+ SOURCE 22 is implemented at location B by source electrode 12. As a result, the voltage drop across the P-N junction 24 at location B is held to 0 volts. This condition, however, does not hold for portions of the P-N junction 24 remote from location B. Indeed, the voltage drop between locations A and C can rise above 0.7 volts if sufficient hole current flows between locations A and B in P BASE 20, resulting in a voltage drop from location A to B. In MOSFET 10, there are two mechanisms which can cause this type of hole current. One is known as "leakage" current, which occurs when the MOSFET 10 is in a "blocking" state, in which it does not conduct external device current; the other occurs when the MOSFET 10 is in the process of changing from its conducting state to its blocking state, and an excess of holes in P BASE 20 are caused to flow to the source electrode near location B.

The longer the distance A-B along P-N junction 24, the higher the voltage drop between locations A and B, and the more likely P-N junction 24 will become forward biased above 0.7 volts, with attendant turn-on of the parasitic transistor. Therefore, it would be desirable to reduce the distance A-B, for example, by reducing the length of N+ SOURCE 22; that is, its horizontal dimension in FIG. 1A. The prior art technique of fabricating electrical shorts in the MOSFET 10, such as at location B, however, results in a lengthy N+ SOURCE 22. This is because the technique includes a delicate alignment step, and the N+ SOURCE 22 must be long in order to accommodate the unavoidable alignment tolerance. These particulars, as well as further drawbacks of the prior art technique, can be more easily appreciated by referring to FIGS. 1B and 1C.

FIG. 1B shows a semiconductor body 28 including N+ DRAIN 30, N region 18, and P BASE 20. A diffusion barrier or mask 32, such as silicon dioxide, is provided on the upper surface 33 of the body 28. The diffusion mask 32 defines diffusion window 34 (and adjacent diffusion windows). An N+ diffusion of dopant through the upper surface 33 is performed and forms the N+ SOURCE 22 (shown in phantom).

As shown in FIG. 1C, an etch barrier or mask 38, such as silicon dioxide, is next provided on the upper surface 33. The the mask 38 defines an etch window 40. An etchant is applied through the etch window 40 to remove semiconductor material from the body 28 to form groove 42 (shown in phantom), necessary for implementing the completed MOSFET 10 (FIG. 1). Proper construction of the N+ SOURCE 22 requires that the etch window 40 be aligned as closely as is feasible to the center of the N+ SOURCE 22. However, this alignment step is extremely delicate, since the dimensions involved are exceedingly minute (e.g., on the order of 5 microns).

Because the foregoing alignment step is delicate, precise alignment is not consistently attainable. Consequently, the etch window 40 falls at random within a minimum alignment tolerance 44. In order to accommodate the alignment tolerance 44, the completed N+ SOURCE 22 must be lengthy. This, however, increases the risk of the parasitic transistor turning on. A further drawback of having the N+ SOURCE 22 lengthy is that the individual size of each cell in the MOSFET 10 is increased. This undesirably limits the amount of current that the MOSFET 10 can carry, and reduces the manufacturing yield of operable MOSFETs. Additionally, the inclusion of the foregoing delicate alignment step further reduces the manufacturing yield of operable MOSFETs.

The details of our invention will now be described in connection with the embodiment of FIGS. 2A-2G inclusive, illustrating a preferred method of fabricating a MOSFET.

Figure 2A:
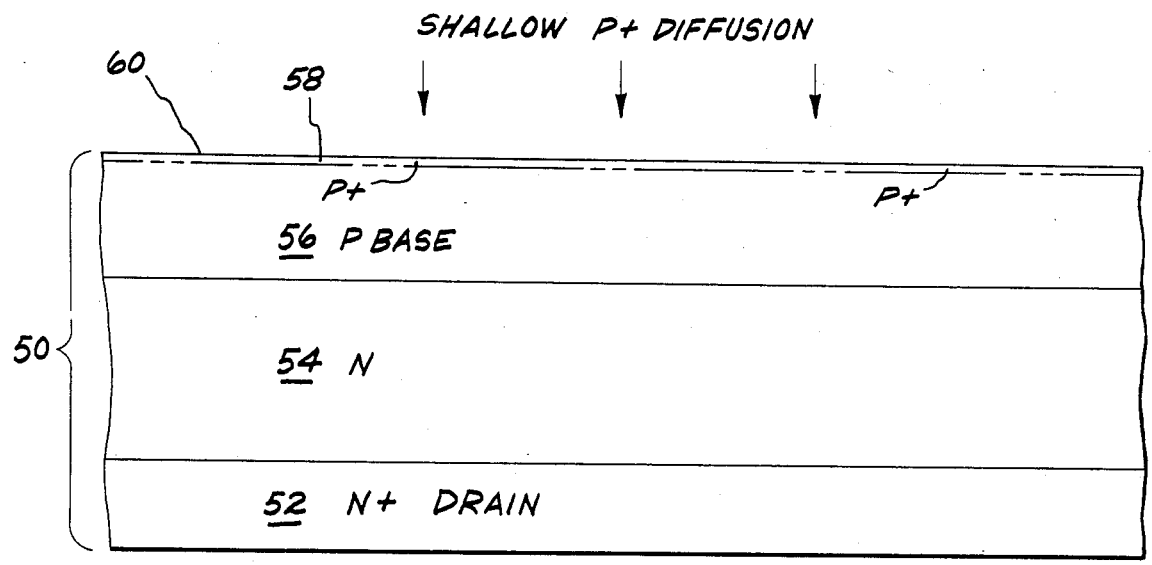

As shown in FIG. 2A, we provide a semiconductor body 50, typically of silicon, and which is suitably identical to the prior art body 28 shown in FIG. 1B. In particular, N+ DRAIN 52 typically comprises a substrate layer, with N-type layer 54 epitaxially grown on N+ DRAIN 52, and P BASE 56 epitaxially grown (or diffused into) the N-type layer 54. This construction is typical of "power" MOSFET, of MOSFETs designed to carry substantial levels of current. Our invention, however, can be practiced with non-power devices.

FIG. 2A additionally illustrates a processing step for implementing P+ region 58 (shown in phantom). We diffuse a very shallow (i.e., a fraction of a micrometer) layer of P-type dopant, such as boron, at a high dopant concentration, into the upper surface 60 of the wafer 50. This step is known in the art as predeposition.

Figure 2B:
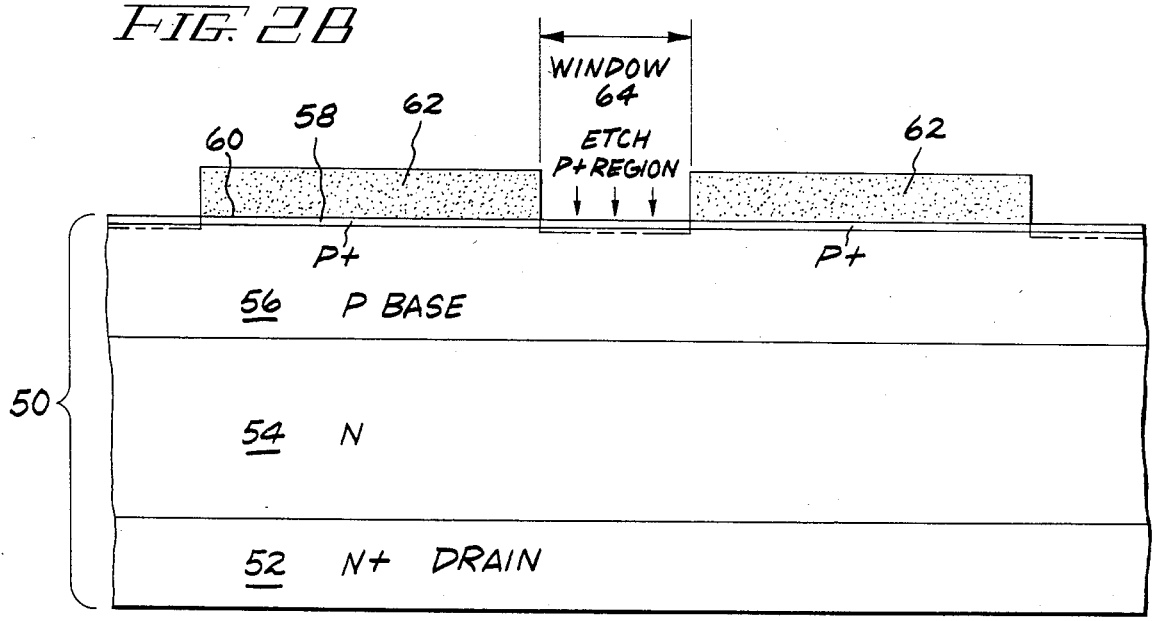

We then provide a thick layer (e.g., 2 micrometers) of silicon dioxide, or other suitable diffusion resistant material, to the body upper surface 60, and pattern it using photolithograhy (a known technique) to provide a mask 62, as shown in FIG. 2B, which defines a window 64.

As shown in phantom in FIG. 2B, we etch away the P+ region 58 in the window 64 of the centrally depicted cell, or repeated unit of structure in the body 50, and simultaneously etch away the P+ region 58 in adjacent cells. (For simplicity, the description below is explicit only as to the central cell). This etching need not be anisotropic, or directional. A suitable etching technique, for example, is planar plasma etching.

Next, as illustrated in FIG. 2C, we diffuse an N-type dopant, such as phosphorus, through the window 64 to form N+ SOURCE 66 (shown in phantom). During this diffusion step, the shallow P+ region 58 is "driven", or thermally diffused deeper, into the body 50 (as is apparent in the FIG. 2D). A region E is defined as that region encompassing the intersection of the N+ source region 66, the P-base region 56, and the driven P+ region 58.

After the N+ SOURCE 66 is implemented, the mask 62 serves an additional purpose as an etch barrier or mask, as shown in FIG. 2D. Through the same window 64, defined by the mask 62, we apply an etchant to etch into the semiconductor body 50. In the preferred embodiment, the etchant is dependent upon the crystal orientation of the silicon body 50, such orientation being (100). An orientation-dependent etchant, a specific type of anisotropic etchant, etches in different directions in the body 50 at different rates, and, as shown in FIG. 2D, etches completely through the N+ SOURCE 66 and produces a V-shaped groove 68 (shown in in phantom), with or without a flat bottom 70. The flat bottom version is illustrated in FIG. 2D and the V bottom embodiment is not shown. Such etchant does not undercut beneath the mask 62 and hence does not completely etch away the N+ SOURCE 66. This allows portions of N+ SOURCE 66 beneath the mask 62, or "shoulders" 72, to remain intact.

Figure 2E:
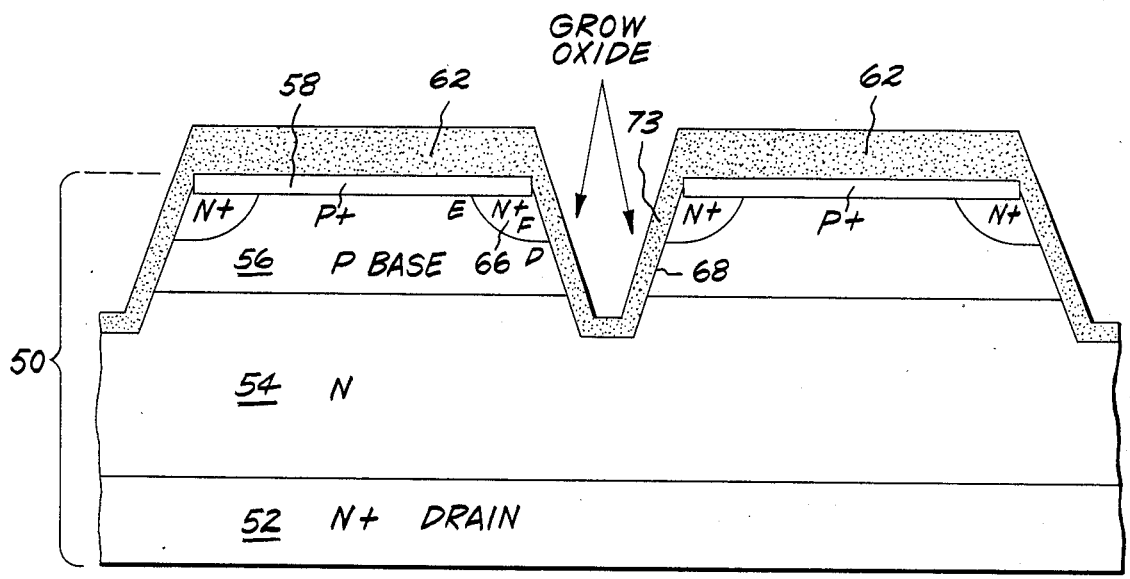

As shown in FIG. 2E, we next provide an insulating layer 73 to cover the surface of the groove 68. A preferred way of implementing the layer 73 is by growing it as an oxide of the semiconductor body 50. This is accomplished by exposing the body 50 to oxygen at high temperature.

Figure 2F:
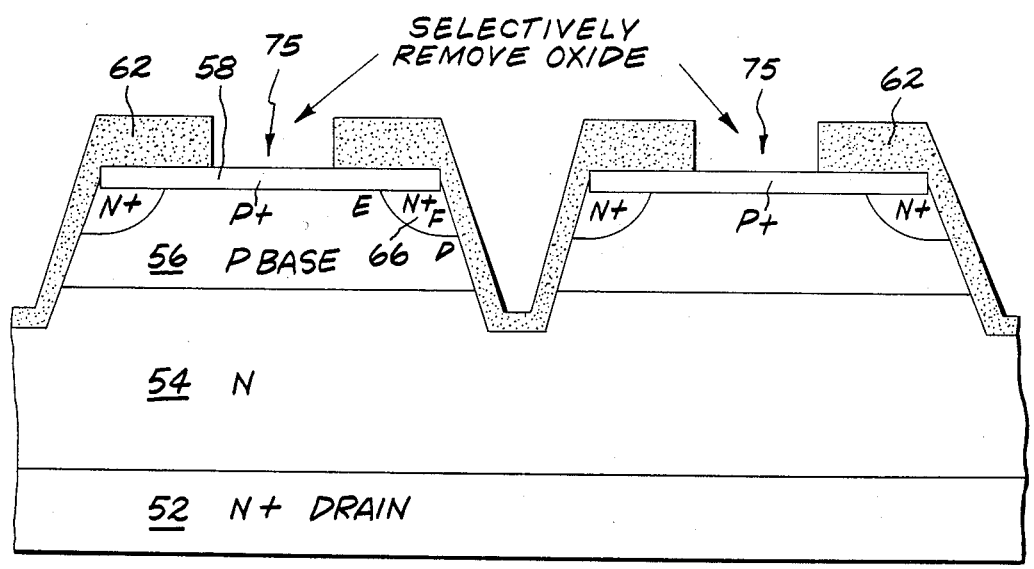

Next, as shown in FIG. 2F, we selectively remove portions of the insulating layer 62 to provide openings 75. This is accomplished by photolithography.

We then apply metallization over the entire upper surface of the structure of FIG. 2F, and selectively remove portions of such metallization, as shown in FIG. 2G. The remaining metallization 74 forms a gate electrode, and the remaining metallization 76 forms a source electrode in contact with the P+ region 58. We lastly apply metallization 78 to the lower surface of the N+ DRAIN 52 to form a rain electrode and implement the MOSFET 80.

In the MOSFET 80, the P+ region 58 advantageously completes an electrical short between P BASE 56 and N+ SOURCE 66, e.g., at location E. This electrical short has three components. One component comprises the junction 82 between the P region 58 and the N+ SOURCE 66, which junction forms a "tunnel" junction, because each of the foregoing regions is heavily doped (i.e., each has a doping concentration in excess of about $10^{19}$ dopant atoms per cc of silicon). The tunnel junction 82 constitutes a low resistance connection between the N+ SOURCE 66 and the P+ region 58, at least during normal device operation. Tunnel junctions are discussed more fully, for example, in S. M. Sze, *Physics of Semiconductor Devices*, New York: Wiley-Interscience, 1969, Chapter 4. The second component of the electrical short at location E comprises the junction 84, between P BASE 56 and P+ region 58. The junction 84 constitutes a low resistance path between the P BASE 56 and the P+ region 58, because holes can freely pass from the P BASE 56 to the P+ region 58. The third component of the electrical short at location E comprises the P+ region 58, in the vicinity of location E, between the tunnel junction 82 and the junction 84. This is because the region 58 is highly doped, and so constitutes a low resistance path between the junctions 82 and 84. All three of the foregoing low resistance paths collectively provide a low resistance path between the P BASE 56 and the N+ SOURCE 66, thus implementing the electrical short between these regions at location E.

The tunnel junction 82 is also part of a low resistance path between the N+ SOURCE 66 and the source electrode 76, such low resistance path also including the highly-doped P+ region 58. Because the P+ region 58 is highly-doped and thus conductive, the source electrode 76 only needs to make contact with it at isolated locations.

The MOSFET 80 possesses significant advantages over the prior art MOSFET 10, described above. First and foremost, the length of the N+ SOURCE 66 is drastically reduced compared to the prior art. This is because all but the shoulders 72 of the N+ SOURCE 66 have been etched away. Accordingly, the electrical short at location E is highly effective. This is because hole current flowing in P BASE 56, from location D to location E, produces only a low voltage drop because the distance D-E is short. Accordingly, it is unlikely that any portion of P-N junction 86 between P BASE 56 and N+ SOURCE 66 (e.g., between locations D and F) can become excessively forward biased. This greatly reduces the likelihood of turn-on of the parasitic bipolar transistor in the MOSFET 80 (i.e., the transistor formed by N-region 54, P BASE 56, and N+ SOURCE 66).

Significantly, MOSFETs made by our invention allow reduced cell size using present state of the art processing techniques. For a typical MOSFET, this size reduction amounts to about 50 percent. This dramatically increases the manufacturing yield of operable MOSFETs, which makes them less costly. Additionally, the size reduction increases the current-carrying capability of a 500 volt-rated MOSFET by about 30 percent, and of a 50 volt-rated MOSFET by about 100 percent. Accordingly, smaller and less costly MOSFETs made in accordance with our invention are needed in a given application, compared with MOSFETs made by the conventional methods.

Our foregoing method of fabricating the MOSFET 80 could be modified, for example, by employing an anisotropic etchant other than the preferred orientation-dependent etchant mentioned above. However, such other suitable etchants must allow shoulders 72 of the N+ SOURCE 66 to remain intact. By way of example, these other suitable etchants include a vertically collimated beam of reactive ions and a planar plasma etchant. These etchants tend to form a groove 68 (FIG. 2D) having more of a U-shape than a V-shape. These etchants do not require the semiconductory body to be (100) crystal oriented, as does the preferred, orientation-dependent etchant.

A further modification of our foregoing method of fabricating the MOSFET 80 (FIG. 2G) is to form the gate electrode 74 from a conductive refractory material, rather than by metallization. Suitable refractory materials include highly-doped polysilicon, molybdenum silicide, and tungsten silicide. If polysilicon were used, our foregoing method could be altered as follows, by way of example. After the insulating layer 62 of FIG. 2E has been formed, polysilicon (not illustrated) is deposited on the upper surface of the structure shown in FIG. 2E. The polysilicon layer is highly doped to make it conductive, and is patterned to remove it from the desired locations for the source electrode. A layer of oxide is grown on the polysilicon by exposing it to oxygen at high temperature, openings similar to openings 75 (FIG. 2F) are made, and, finally, metallization is applied to the upper surface of the modified structure to implement the source electrode.

Our invention is applicable to semiconductor devices other than MOSFETs. Another appropriate semiconductor device is an insulated gate rectifier (IGR), shown in FIG. 3. The IGR 90 includes a $P^{30}$ substrate 92, in contrast with the $N^{30}$ DRAIN substrate 52 of the MOSFET 80. With this substitution, the foregoing method of fabricating the present embodiment of our invention is applicable to IGR 90.

Details of the structure and operation of an IGR device, such as the IGR 90, are described in the above-referenced patent application, Ser. No. 212,181.

Our invention attains advantages for the IGR 90, which are similar to the above-mentioned advantages for the MOSFET 80. In particular, the parasitic N-P-N transistor in the IGR 90, formed by N region 94, P region 96, and $N^{30}$ region 97, is electrically coupled in thyristor fashion to a parasitic P-N-P transistor—namely, the transistor formed by $P^{30}$ region 92, N region 94, and P region 96. Accordingly, these parasitic transistors can "latch", or become established in a current-conducting state, if the N-P-N (or upper transistor) is allowed to turn on. Once the IGR 90 becomes latched, control of its current level by its gate 98 is totally lost. This risk of the IGR 90 becoming latched is always present when the IGR 90 is in its active or current-carrying state. Our invention greatly diminishes this risk by preventing the N-P-Ntransistor from becoming excessively active. This is because the distance H-I in P region 96 along P-N junction 100 is so short that P-N junction 100 (e.g., between locations H and J) cannot become excessively forward biased. Additionally, the IGR 90 can have a reduced cell size, compared to IGRs made from prior art methods, enabling the IGR 90 to be made more economically and carry more current.

The modifications to our method of fabricating the MOSFET 80, described above, apply equally well to the IGR 90.

Figure 4C:
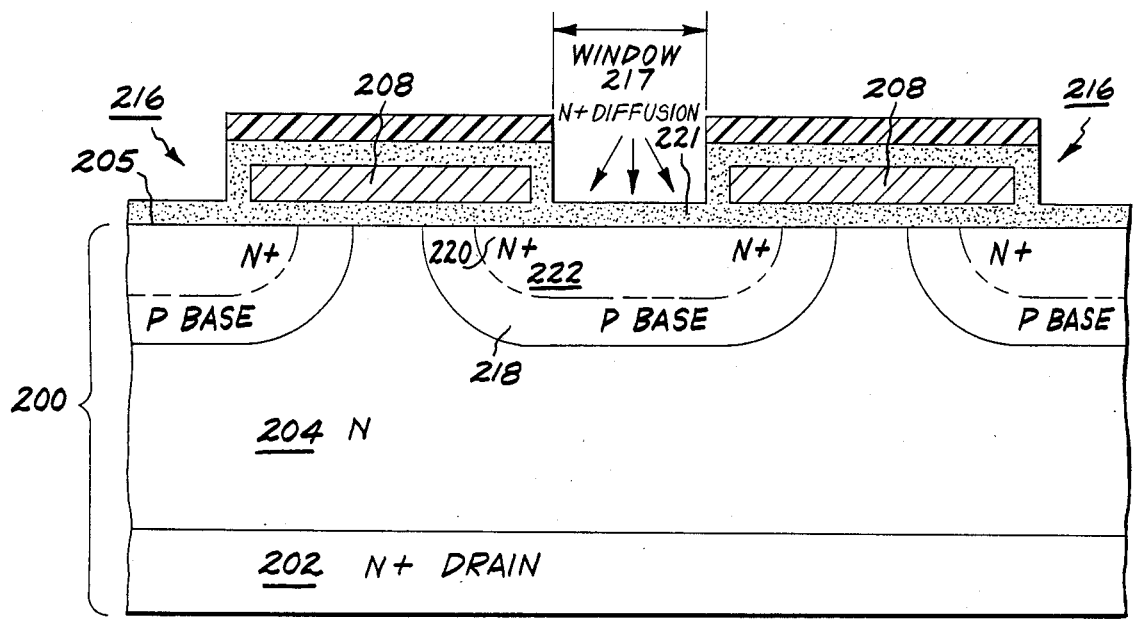

Our invention will now be described in connection with the embodiment of FIGS. 4A–4E, illustrating a preferred method of fabricating a MOSFET. As shown in FIG. 4A, we provide a semiconductor body 200, typically of silicon. The body 200 typically comprises a substrate 202, constituting an $N^{30}$ DRAIN, and an N region 204, typically epitaxially grown on the $N^{30}$ DRAIN 202. This construction is typical of power MOSFETs, although our invention can be practiced with non-power devices.

On the upper surface 205 of the body 200, we form an insulating layer 206, suitably by growing an oxide on the body 200. Next, we form a conductive refractory material 208 (shown partially broken away) on the insulating layer 206. Where, for example, the refractory material comprises polysilicon we dope it highly to make it conductive. We then preferably form insulating layer 210 on the upper surface of the refractory material 208. With the refractory material 208 comprising polysilicon, the insulating layer 210 suitably comprises an oxide grown thereon. Finally, we form a layer 211 on the insulating layer 210, if provided, or directly on the refractory material 208. The layer 211 comprises a material, such as aluminum oxide, which is resistant to an etchant, that etches through silicon dioxide and silicon during a processing step described below.

We then pattern the layers 206, 208, 210 and 211 by conventional photolithography to produce mask 216, appearing in FIG. 4B. The mask 216 defines a window 217 and serves as a diffusion barrier when we next make a P-type diffusion through the window 217 to form P BASE 218 (shown in phantom).

As shown in FIG. 4C, we make an $N^{30}$ diffusion through the window 217 to form $N^{30}$ SOURCE 220 (shown in phantom). The $N^{30}$ diffusion extends laterally beneath the refractory material 208, i.e., in region 222, approximately the same distance as it diffuses vertically downward. This diffusion occurs at high temperature in an oxidizing atmosphere. As a result, the exposed surfaces 219 (shown in FIG. 4B) of the refractory material 208 become oxidized so that the refractory material 208 becomes surrounded by insulating material, as shown in FIG. 4C. Similarly, the exposed portions of the semiconductor body surface 205 (shown in FIG. 4B) becomes oxidized to form oxide layer 221, (shown in FIG. 4C).

Figure 4D:
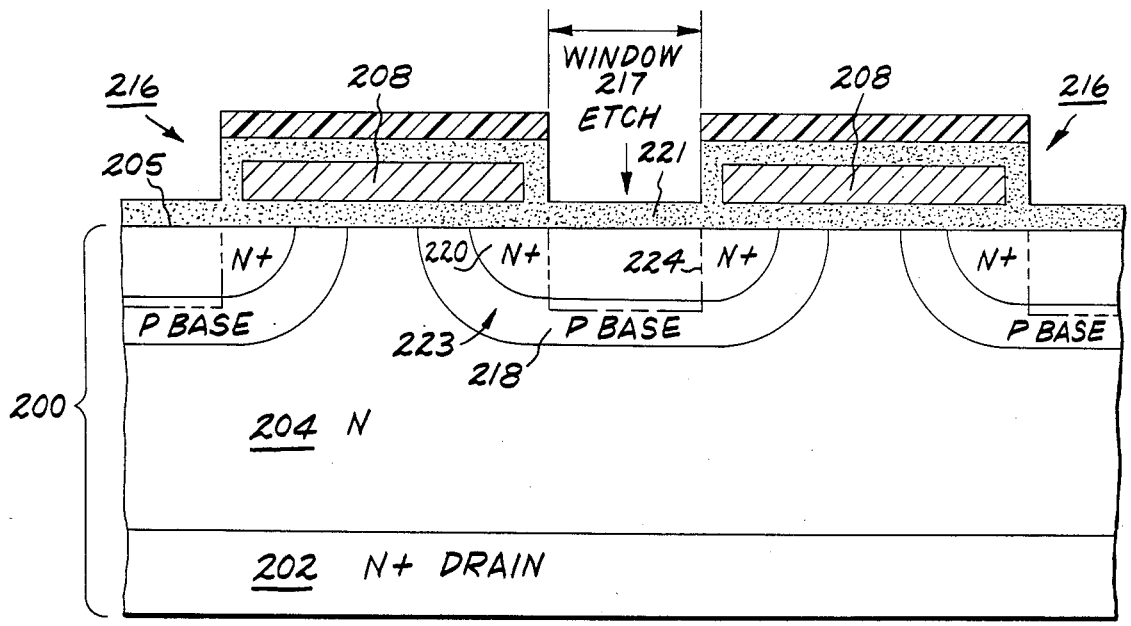

As illustrated in FIG. 4D, we next apply an anisotropic etchant (described below) to the oxide layer 221, through the same window 217 which served as the diffusion window for the $N^{30}$ SOURCE 220. This etchant etches through the oxide layer 221 and at least substantially all the way through $N^{30}$ SOURCE 220, but allows shoulders 223 of the $N^{30}$ SOURCE 220 to remain intact. In the preferred embodiment, this etchant suitably comprises a vertically collimated beam of reactive ions or a planar plasma etchant, and forms a generally U-shaped groove 224. Alternatively, a V-shaped groove (not illustrated) could be formed by first using one of the preceeding etchants to remove the oxide layer 221, and then using an orientation-dependent etchant (such as a mixture of potassium hydroxide and isopropanol, in the approximate ratio of 3 to 1) to etch into the semiconductor body 200. In this case, the body 200 would need to have a (100) crystal orientation, and an insulating layer 210 (FIG. 4A) is necessary, because the layer 211 (at least where it comprises aluminum oxide) is removed by the orientation-dependent etchant (at least where it comprises potassium hydroxide).

Figure 4E:
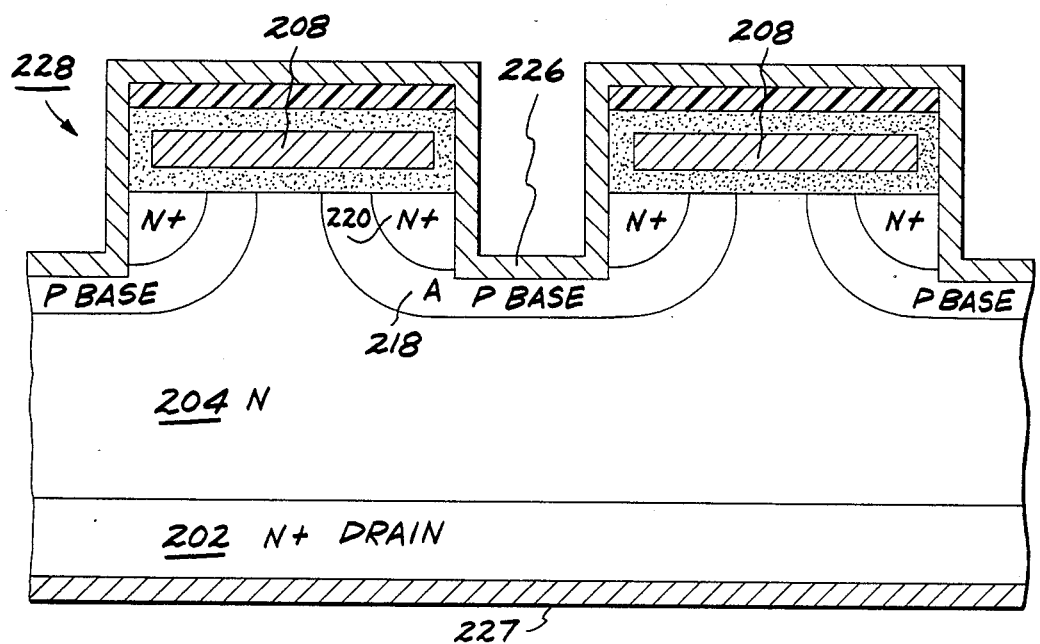

We then form the MOSFET 228 as shown in FIG. 4E by applying metallization 226 and 227 to the upper and lower surfaces, respectively, of the structure of FIG. 4D. An electrical short in the MOSFET 228 exists at location A, where the metallization 226 electrically connects the P BASE 218 to the N+ SOURCE 220.

Prior art for the MOSFET 228 (as described in detail in a discussion by B. J. Baliga, "Silicon Power Field Controlled Devices and Integrated Circuits", in *Silicon Integrated Circuits:Part B*, edited by D. Kahng, New York: Academic Press (1981), pages 209–228) has basically the same drawbacks of the prior art MOSFET 10, shown in FIG. 1A and described above. These drawbacks include having a lengthy SOURCE, requiring a delicate alignment step for implementing electrical shorts, and including more processing steps to implement electrical shorts. All of these drawbacks are obviated by the present embodiment of our invention.

Figure 4F:
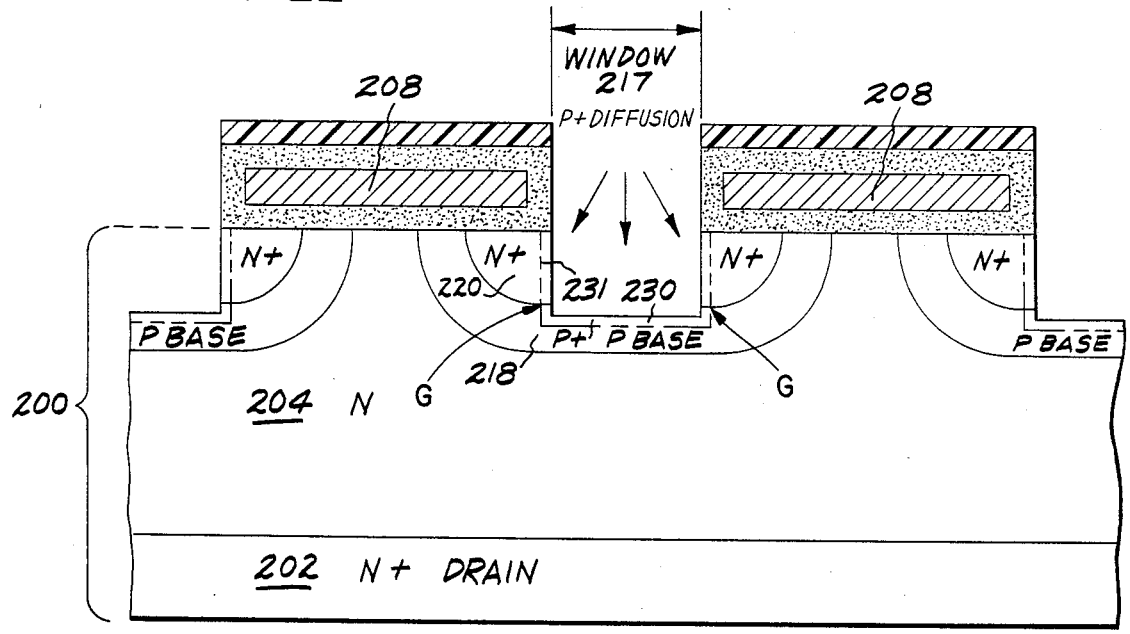
Figure 4G:
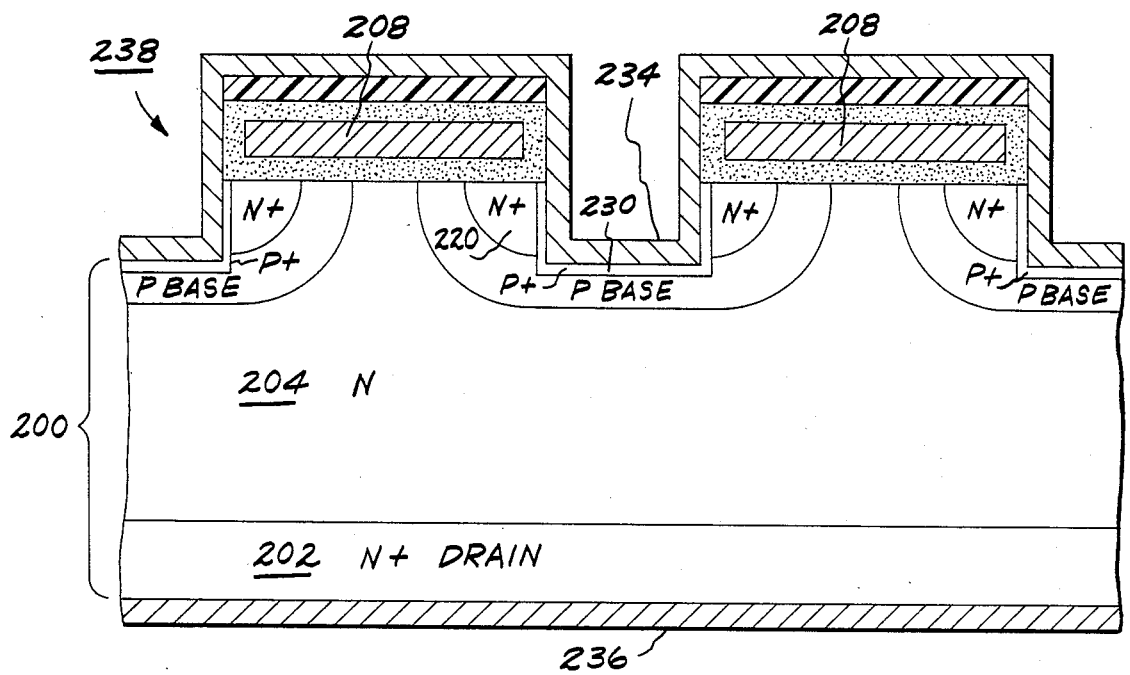

In a preferred modification of the present embodiment, we form more reliable electrical shorts by using tunnel junctions To implement this modification, we carry out a P+ diffusion to form P+ region 230, as shown in phantom in FIG. 4F, upon completing the etching step shown in FIG. 4D. Both the P+ region 230 and the N+ SOURCE 220 are highly doped so that the junction 231 between them comprises a tunnel junction. An electrical short between P BASE 218 and N+ SOURCE 220 exists at location G, adjacent tunnel junction 231 (in similar fashion as with the electrical short at location E in the MOSFET 80 of FIG. 2G). We next implement the modified MOSFET 238 as shown in FIG. 4G by applying metallization 234 and 236 to the upper and lower surfaces, respectively, of the structure of FIG. 4F.

Figure 5:
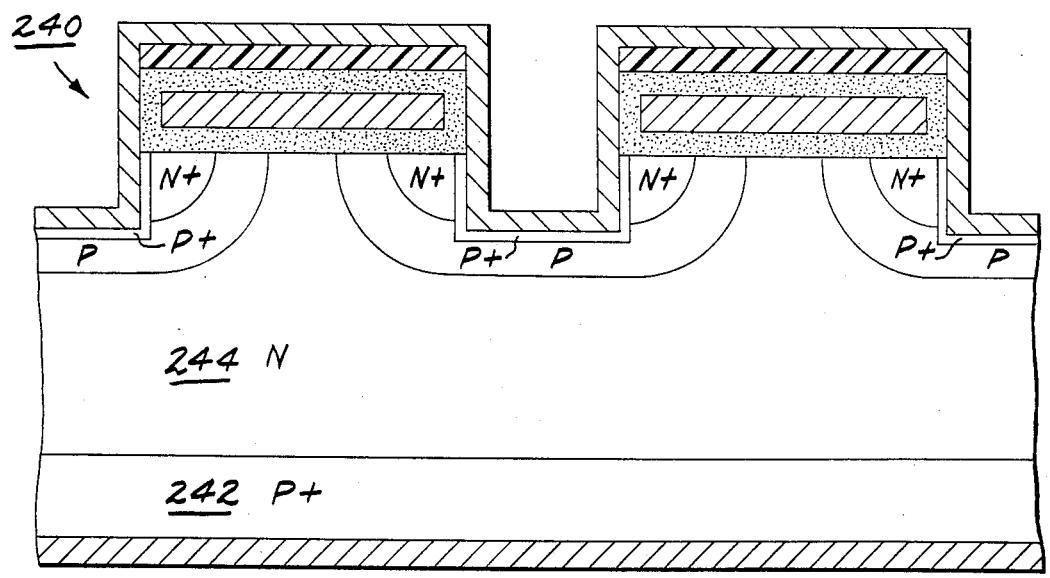
FIG. 5 is a view similar to FIG. 4G, illustrating an alternative semiconductor device in accordance with our invention.

The present embodiment of our invention applies to semiconductor devices other than MOSFETs. Another appropriate semiconductor device is an insulated gate rectifier (IGR) 240, as shown in FIG. 5. The IGR 240 is similar to the MOSFET 238 (FIG. 4G), except that the IGR 240 includes a P+ substrate 242, in contrast with the N+ DRAIN substrate 202 of the MOSFET 238. With this substitution, the foregoing method of fabricating of the present embodiment of our invention is applicable to the IGR 240.

While the invention has been described with respect to specific embodiments, many modifications and substitutions will be apparent to those skilled in the art. For example, complementary semiconductor devices could be made, in which P-type material is used rather than N-type material, and vice-versa. Further, a "MOSFET" is intended to describe any form of insulated gate field-effect transistor. Additionally, the diffusion steps described herein could include the step of ion implanting—a technique of injecting dopant atoms into a semiconductor body—before the dopant atoms are diffused deeper into the semiconductor body. It is, therefore, to be understood that the appended claims are intended to cover these and all such modifications and substitutions as fall within the true spirit and scope of the invention.

What is claimed as our invention and desired to be secured by Letters Patent of the United States is:

1. In a method of fabricating a semiconductor device of the type wherein a mask, defining a window, is applied to a major surface of a semiconductor body, and a first region of one dopant type is formed in a second region of opposite dopant type in said body by diffusing a dopant of said one type into said body through said window, with said mask serving as a diffusion barrier, the improvement comprising:

anisotropically etching into said body through said window, with said mask serving as an etch barrier; said etch penetrating at least substantially all the way through said first region but allowing shoulders of said first region to remain intact; and forming a short in contact with at least a portion of said first and second regions.

2. A method of fabricating a semiconductor device in accordance with claim 1 wherein said first region and said short are doped to a high level of conductivity to establish a tunnel junction between said short and said first region.

3. A method of fabricating a semiconductor device in accordance with claim 1 wherein said short is formed in said major surface.

4. A method of fabricating a semiconductor device in accordance with claim 1 wherein said etch penetrating at least substantially all the way through said first region, establishes a cut surface through said first and second regions and said short is formed in contact with said cut surface through said first and second regions.

5. The invention according to claim 1 wherein said semiconductor body comprises a substrate with an epitaxial layer thereon.

6. The invention according to claim 5 wherein said substrate comprises a DRAIN of a MOSFET of said one dopant type.

7. The invention according to claim 5 wherein said substrate comprises a region of an insulated gate rectifier of said opposite dopant type.

8. The invention according to claim 1 wherein said mask comprises conductive refractory material and an oxide of said semiconductor body, said oxide insulating said refractory material from said body.

9. The invention according to claim 1 wherein said one dopant type comprises N-type.

10. The invention according to claim 9 wherein said semiconductor body comprises silicon.

* * * * *